United States Patent

Hsu et al.

Patent Number: 6,153,913
Date of Patent: Nov. 28, 2000

[54] ELECTROSTATIC DISCHARGE PROTECTION CIRCUIT

[75] Inventors: Chen-Chung Hsu, Hsinchu Hsien; Sheng-Hsing Yang, Hsinchu, both of Taiwan

[73] Assignee: United Microelectronics Corp., Hsinchu, Taiwan

[21] Appl. No.: 09/345,674

[22] Filed: Jun. 30, 1999

[51] Int. Cl.[7] .................................................. H01L 23/62
[52] U.S. Cl. ........................ 257/355; 257/356; 257/357; 257/360; 257/367; 257/369; 257/388; 257/401; 257/204; 257/173
[58] Field of Search ..................................... 257/355, 360, 257/356, 357, 367, 369, 388, 401, 204, 173

[56] References Cited

U.S. PATENT DOCUMENTS

| | | | |
|---|---|---|---|
| 5,516,717 | 5/1996 | Hsu | 437/56 |
| 5,517,048 | 5/1996 | Kosaka | 257/355 |
| 5,646,808 | 7/1997 | Nakayama | 361/56 |
| 5,721,439 | 2/1998 | Lin | 257/204 |
| 5,744,839 | 4/1998 | Ma et al. | 257/356 |
| 5,838,043 | 11/1998 | Yuan | 257/355 |
| 5,962,876 | 10/1999 | Yu | 257/133 |
| 6,025,631 | 2/2000 | Lin | 257/355 |
| 6,064,093 | 5/2000 | Ohita | 257/355 |
| 6,064,094 | 5/2000 | Infrater | 257/355 |
| 6,064,095 | 5/2000 | Fu | 257/355 |

*Primary Examiner*—Matthew Smith
*Assistant Examiner*—Belur Keshavan
*Attorney, Agent, or Firm*—Hickman Coleman & Hughes, LLP

[57] ABSTRACT

The invention provides an ESD protection circuit, which is formed on a semiconductor substrate. There is at least one MOS transistor branches out at a place between an I/O port and an internal circuit. The MOS transistor includes a drain region, a source region, a gate oxide layer, and a gate electrode. The source and the drain regions are formed in the substrate and located on each side of the gate electrode. An insulating layer is formed over the substrate to cover the MOS transistor. A drain contact is formed in the insulating layer with a contact to the drain region of the MOS transistor so that the drain region can be coupled to the internal circuit through the drain contact. A source contact is formed in the insulating layer with a contact to the source region of the MOS transistor so that the source region can be coupled to the I/O port through the source contact. Several floating silicide blocks is located between the insulating layer and the substrate at the drain region. The silicide blocks are about evenly distributed within the drain region, and preferably distributed in a structure like grid nodes with a shift for the adjacent node row. The silicide includes self-aligned silicide.

13 Claims, 4 Drawing Sheets

ELECTROSTATIC DISCHARGE
PROTECTION CIRCUIT

BACKGROUND OF THE INVENTION

1. Field of Invention

The present invention relates to a semiconductor structure. More particularly, the present invention relates to an electrostatic discharge (ESD) protection circuit using a floating salicide.

2. Description of Related Art

In the fabrication of an integrated circuit (IC) device, such as dynamic random access memory (DRAM) or statistic random access memory (SRAM), ESD is one of the main factors causing IC damage. For example, when one walks on a carpet with semiconductor wafers, if relative humidity (RH) is high, an electrostatic voltage of about a few hundred volts may exist on one's body and wafers. If the RH is very low, the electrostatic voltage may be even as high as about a few thousand volts. If a conductive object occasionally contacts the wafers, a strong ESD could occur and damage the ICs on the wafers. In order to solve the ESD problem, typically an ESD protection circuit branches out at a place between an internal circuit and input/output (I/O) pads. The ESD protection circuit usually is formed by an on-chip manner.

Moreover, since the thickness of the gate oxide in a semiconductor device is greatly reduced as integration goes high. This causes that a break voltage of the gate oxide is approaching to a junction breakdown voltage of source/drain junction or even is lower. In this situation, the capability of the ESD protection circuit is largely degraded. In addition, the internal circuit is usually designed according to a minimum design rule without proper design for resisting a large transient current induced by the ESD process. The addition design to resist ESD usually needs sufficient space at, for example, the rim from a contact to a diffusion region or the rim from a contact to a gate electrode. As a result, the ESD effect easily causes a damage to the device as the integration is greatly reduced. The ESD effect becomes one of the main problems causing device defect in the submicron semiconductor fabrication. It is important to reduce the ESD effect for the semiconductor manufacturers.

FIG 1A and FIG. 1B are two circuits, schematically illustrating two conventional ESD protection circuits. In FIG. 1A, electrostatic charges flow to an internal circuit 10 through an input port (INP). The electrostatic charges can be absorbed by a ground Vss through an N-type metal-oxide semiconductor (MOS) transistor N1 before the charges enter the internal circuit 10. The internal circuit 10 is thereby protected from the electrostatic charges. The N-type MOS transistor perform as a conventional ESD protection circuit. In FIG. 1B, the electrostatic charges also flow to the internal circuit 10 but have been absorbed another ESD protection circuit, which includes an N-type MOS transistor (NMOS) N1 and a P-type MOS (PMOS) transistor P1. The NMOS transistor N1 is coupled to a ground source Vss, and the PMOS transistor P1 is coupled to a system voltage source $V_{DD}$. As a result, the transistors N1 and P1 work together as the ESD protection circuit to protect the internal circuit 10 from ESD effect.

FIG. 2 is a cross-sectional view, schematically illustrating the ESD protection circuit with respect to FIG. 1. FIG. 3 is a top view, schematically the ESD protection circuit with respect to FIG. 1, in which the cross-sectional view of FIG. 2 is taken along the cross-sectional line I–I'. In FIG. 2, the NMOS transistor N1 is formed on a semiconductor substrate 20. The NMOS transistor N1 includes a drain region 22, a source region 24, a gate oxide layer 25 on the substrate 20, and a gate electrode 26 on the gate oxide 25. There is an insulating layer 28 formed over the substrate 20 to cover the NMOS transistor N1. A contact 30 is formed in the insulating layer 28 to have coupling with the drain region 22, and a contact 32 is formed in the insulating layer 28 to have coupling with the source region 24. The opposite end of the contact 30 is coupled to an I/O pad, and the opposite end of the contact 32 is coupled to a ground source Vss.

In FIG. 3, the contacts 30, 32 are shown with a circular structure on the source region 24. The drain region 22 is located between two adjacent source regions 24 but with a separation by the gate electrodes 26, which are also coupled together. The source region 24 and the gate electrode 26 are coupled to the ground source Vss, and the drain region 22 is coupled the I/O line. The ESD transient current $I_1$ is directed to the ground source 26 from the contact 30 in the drain region 22.

However, in this conventional design, if the transient current is nonuniformly turned-on, or there are defects in the structure, such as the point defect 34, the transient current $I_1$ is easily crowding at the weak ESD turn-on point and the point defect 34. As the transient current $I_1$ is trapped to the point defect 34, it causes a local high temperature and results in a damage to the integrated circuit device. In this situation, the ESD protection circuit largely loses its protecting function.

SUMMARY OF THE INVENTION

The invention provides an ESD protection circuit, which is formed on a semiconductor substrate. There is at least one MOS transistor branches out at a place between an I/O port and an internal circuit. The MOS transistor includes a drain region, a source region, a gate oxide layer, and a gate electrode. The source and the drain regions are formed in the substrate and located on each side of the gate electrode. An insulating layer is formed over the substrate to cover the MOS transistor. A drain contact is formed in the insulating layer with a contact to the drain region of the MOS transistor so that the drain region can be coupled to the internal circuit and an I/O port through the drain contact. A source contact is formed in the insulating layer with a contact to the source region of the MOS transistor so that the source region can be coupled to a power source, which can be a ground source, through the source contact. Several floating silicide blocks is located between the insulating layer and the substrate at the drain region. The silicide can be a self-aligned Silicide (Salicide). The silicide blocks are about evenly distributed within the drain region, and preferably distributed in a structure like grid nodes with a shift for the adjacent node row. With this structure of the floating silicide blocks, as the transient current flows from the drain contact, the transient current induced by ESD can uniformly distributed in the drain region. A dissipation length of the ESD current can also be sufficiently prolonged to be able to uniformly drift in the drain region and reach to the gate electrode. The function of the ESD protection circuit is thereby improved.

As embodied and broadly described herein, the invention provides an ESD protection circuit with a several floating silicide blocks, which are about uniformly distributed at the drain region around the drain contact. Since the silicide blocks are alternatively and about uniformly distributed in the drain region around the drain contact, The ESD current from the I/O port is forced to flow around the floating blocks. The ESD current thereby is dispersed so as to prevent a trapped current on the point defect from occurring. Moreover, the ESD current can also drift sufficiently longer so that the ESD current can flow around the floating blocks in the drain region before reaching the gate electrode. As a result of the ESD protection circuit of the invention, the performance is effectively improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
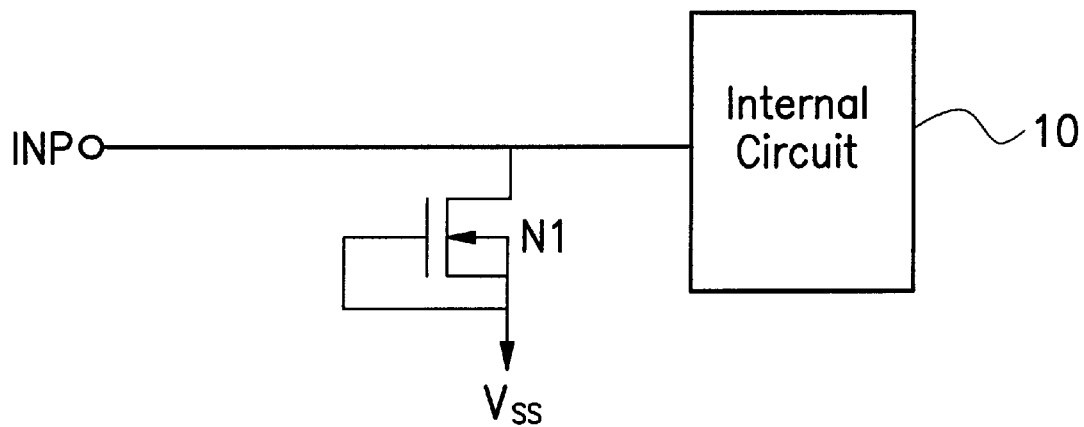
FIG 1A and FIG. 1B are two circuits, schematically illustrating two conventional ESD protection circuits.
Figure 1B:
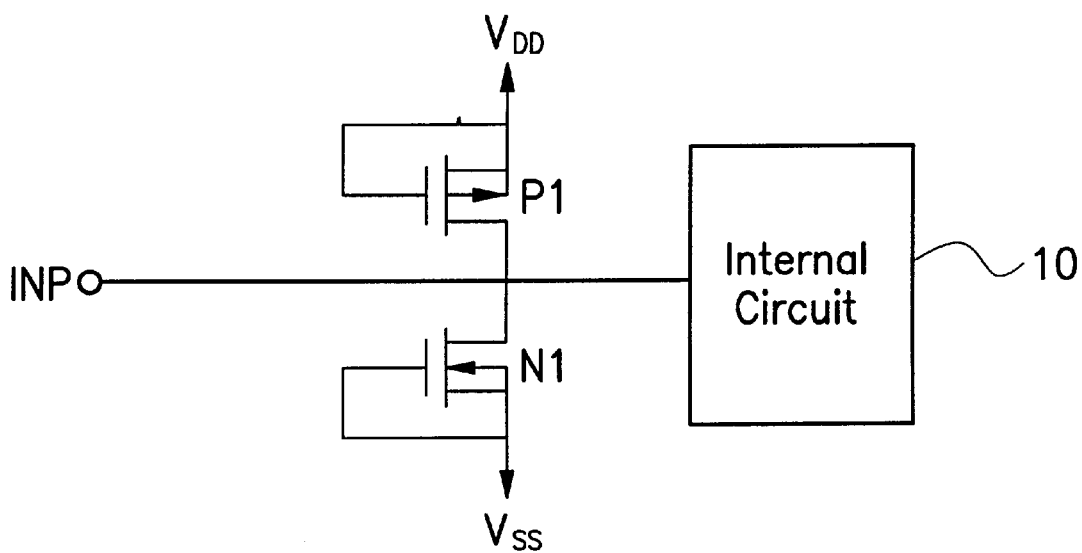
Figure 2:
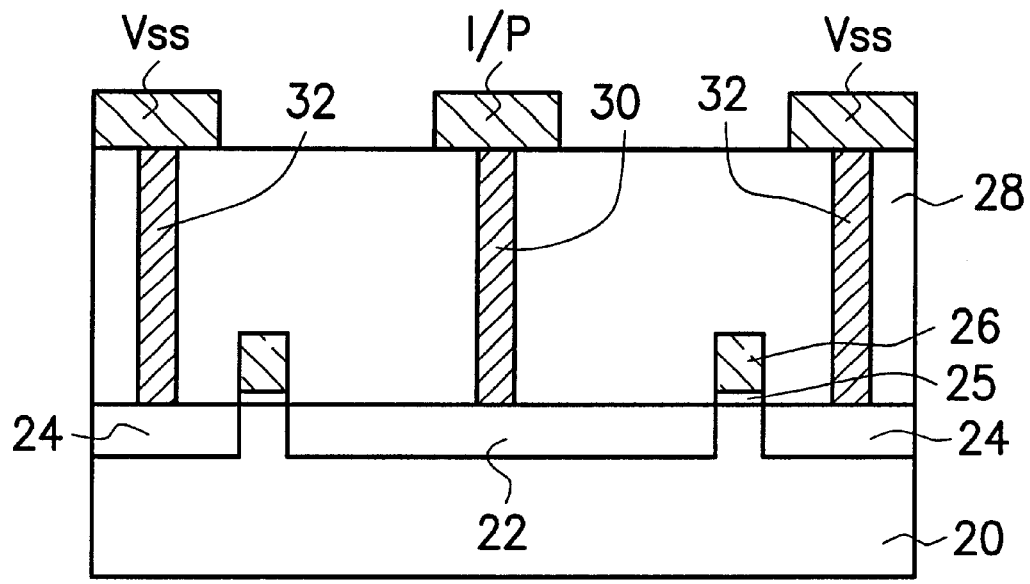
FIG. 2 is a cross-sectional view, schematically illustrating the ESD protection circuit with respect to FIG. 1.
Figure 3:
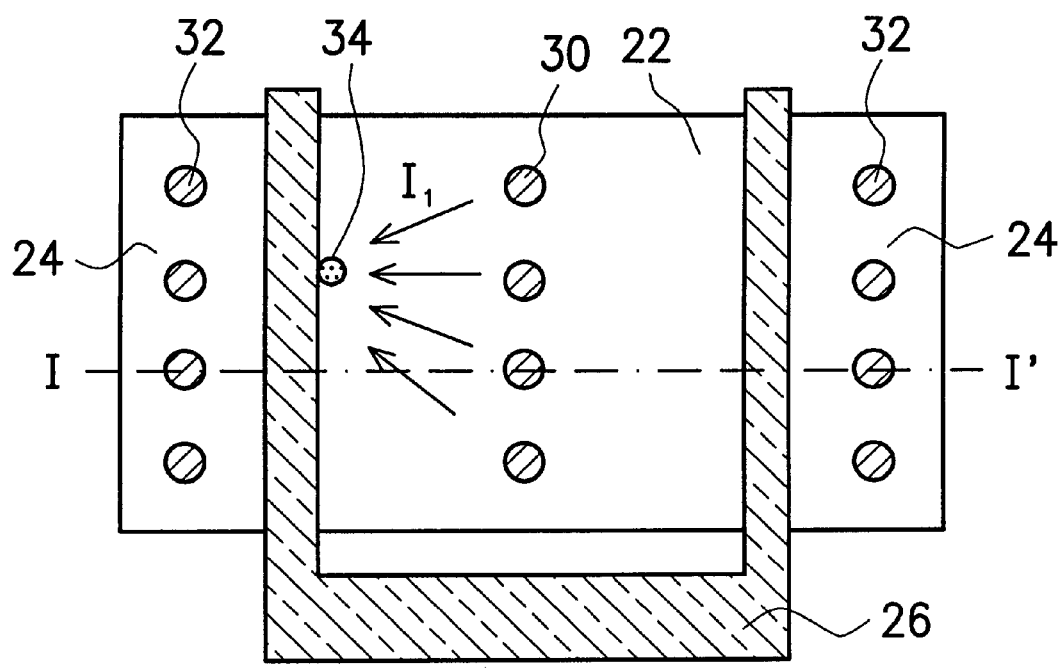
FIG. 3 is a top view, schematically the ESD protection circuit with respect to FIG. 1, in which the cross-sectional view of FIG. 2 is taken along the cross-sectional line I–I'.

An ESD protection circuit provided by the invention is suitable for a conventional architectures, such as those in FIG. 1 and FIG. 2, but the structure of MOS transistors is replaced by the structure introduced by the invention. Several floating silicide blocks, or islands, are formed on the drain region of the MOS transistor with an about uniform distribution. The floating silicide blocks has lower resistance and therefore can absorb ESD current. The floating silicide blocks perform like a current trap center on their edges, thereby can prolong the dissipation length of the ESD current so as to ensure that the ESD current can uniformly drift in the drain region and reach to the gate electrode for grounding. Moreover, the floating silicide blocks can also uniformly disperse the ESD current in the drain region so as to avoid an over trapped current on the point defect of the gate electrode of the MOS transistor, causing an over high temperature.

Figure 4:
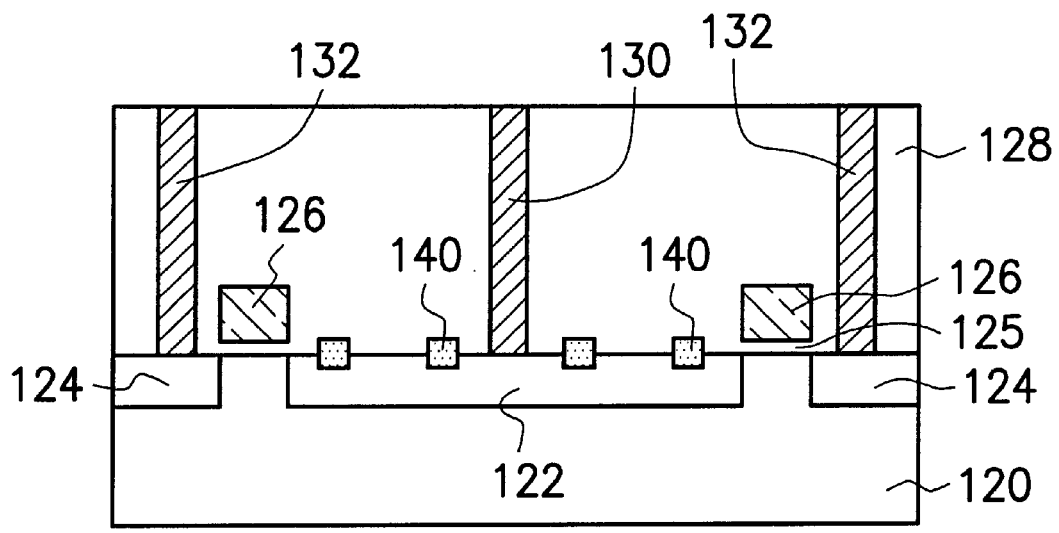
FIG. 4 is a cross-sectional view, schematically illustrating the ESD protection circuit, according to a preferred embodiment of the invention.
Figure 5:
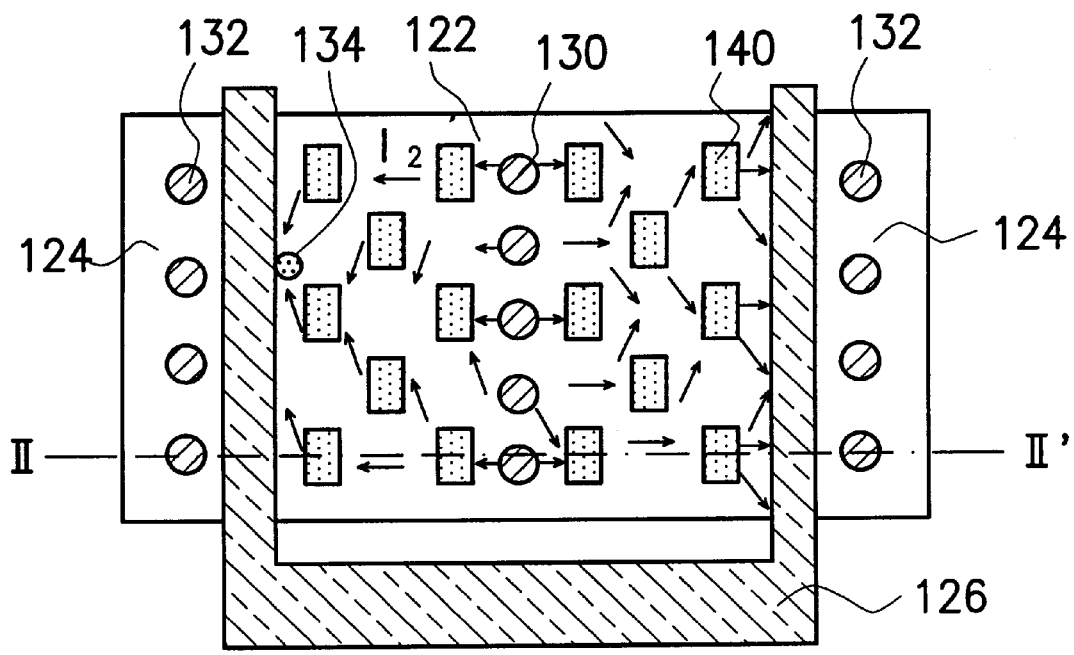
FIG. 5 is a top view, schematically the ESD protection circuit with respect to FIG. 4, in which the cross-sectional view of FIG. 4 is taken along the cross-sectional line II–II'.

For the detail of the invention, a preferred embodiment is provided for detailed descriptions but the invention is not limited by the preferred embodiment. FIG. 4 is a cross-sectional view, schematically illustrating the ESD protection circuit, according to a preferred embodiment of the invention. FIG. 5 is a top view, schematically the ESD protection circuit with respect to FIG. 4, in which the cross-sectional view of FIG. 4 is taken along the cross-sectional line II–II'.

In FIG. 4, at least a MOS transistor is form on a semi-conductor substrate 120. The MOS transistor includes a drain region 122, a source region 124, a gate oxide layer 125 and a gate electrode 126. The drain region 122 and the source region 124 are located in the substrate 120 and at each side of the gate electrode 126. An insulating layer 128 is formed over the substrate 120 to cover the MOS transistor. A drain contact 130 is formed in the insulating layer 128 with a contact to the drain region 122, and a source contact 132 is formed in the insulating layer 128 with a contact to the source region 124. The drain contact 130 allows the drain region 122 to be coupled to an I/O port INP and an internal circuit as shown in FIG. 1A and FIG. 1B. The source contact 132 allows the source region 124 to be coupled to a system power source, which can be, for example, a ground Vss. Several floating silicide blocks, or called islands, 140 are about uniformly distributed on the drain region 122 between the insulating layer 128 and the substrate 120. The silicide can be form by self-aligned technology and therefor is called Salicide. The floating Salicide blocks 140 needs no extra mask in fabrication. Each floating silicide block 140 has, for example, a bar-like structure, a circle structure, a structure in combination of the previous two, or any separated object. Only a bar-like structure is shown in FIGS. 4 and 5.

In FIG. 5, a top view of the floating Salicide block 140 are shown in a bar-like structure, which are regularly and uniformly distributed on the drain region 122 around the drain contact 130. In this example, each block are identical and form several block rows. The block rows are alternatively shifted by a distance, which is, for example, a half of the distance between two adjacent blocks in the row. If the drain contact 130 includes, for example, several individual contacts 130 that are formed in a column, which is surrounded by the floating Salicide blocks 140. The locations of the blocks 140 are like nodes of a slanted grid.

The floating Salicide blocks 140 has lower resistance so that cab trap the ESD current 12, which enters the drain region 122 from the INP ( also referring to FIG. 1A). When the ESD current enters the drain region 122, it is dispersed by the floating Salicide blocks 140. The arrows indicated the current flowing direction. Consequently, the ESD current drift around the floating Salicide blocks 140. As a result, the ESD current is uniformly distributed in the drain region 122. The ESD current is avoided to just be trapped on a point defect 134 on the gate electrode 126. The ESD protection circuit is prevented from damaging due to over high temperature. Moreover, the floating Salicide blocks 140 can prolong the dissipation length of the ESD current so that the ESD current can have sufficient dissipation length to uniformly drift around the floating blocks and reach to the gate electrode 126 that is, for example, coupled to the ground source.

Without conflict to the minimum design principle, the floating Salicide blocks 140 do not increase the device dimension and can efficiently to guide the ESD current to the gate electrode 126. The performance of the ESD protection circuit of the invention is effectively improved.

Figure 6:
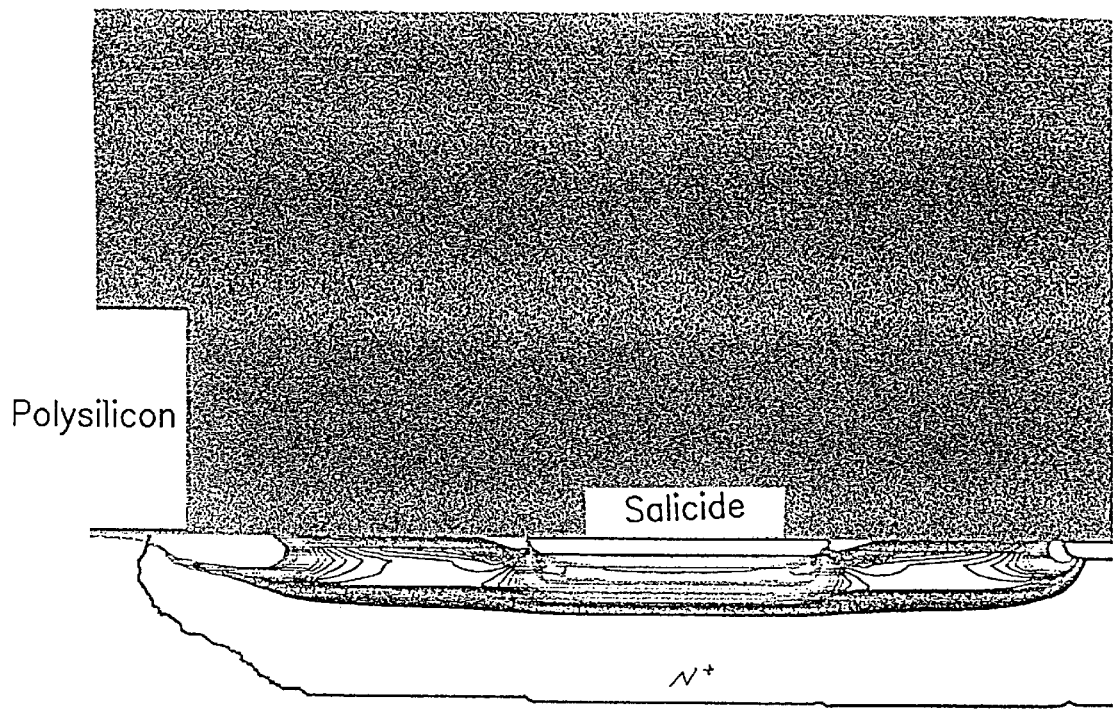
FIG. 6 is a current density plot, schematically illustrating a simulation result of ESD current density distribution in the ESD protection circuit of the preferred embodiment.

FIG. 6 is a current density plot, schematically illustrating a simulation result of ESD current density distribution in the ESD protection circuit of the preferred embodiment. In FIG. 6, a higher current density on the comers of the floating Salicide block is much larger than it surrounding space. This indicates that the floating Salicide blocks, performing like several current trap centers, can effectively disperse the ESD current.

In conclusion, the invention has several advantages as follows:

1. The ESD current can flow around the floating silicide blocks so that the ESD current has sufficient current dissipation length to uniformly flow around the floating Salicide blocks. As a result, the ESD current is dispersed into the drain region without crowd current occurring on the point defects or the weak ESD turn-on points.

2. The floating Salicide blocks are formed without additional mask in fabrication. The device dimension does not also increase according the minimum design principle.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit, comprising:

a gate electrode with a gate oxide layer located on a semiconductor substrate;

a drain region and a source region in the semiconductor substrate at each side of the gate electrode;

an insulating layer covering over the gate electrode, the source region and the drain region;

at least one drain contact in the insulating layer so as to have a contact to the drain region;

at least one source contact in the insulating layer so as to have a contact to the source region; and a plurality of floating silicide blocks about uniformly scattering on the drain region, wherein the floating silicide blocks are between the insulating layer and the semiconductor substrate at the drain region.

2. The ESD protection circuit claim 1, wherein the floating silicide blocks are arranged on nodes of a slanted grid-like structure.

3. The ESD protection circuit claim 1, wherein shapes of the floating silicide blocks comprise a bar-like shape.

4. The ESD protection circuit claim 1, wherein shapes of the floating silicide blocks comprise a circular-like shape.

5. The ESD protection circuit claim 1, wherein shapes of the floating silicide blocks comprises a combination of various geometric shapes.

6. The ESD protection circuit claim 1, wherein the floating silicide blocks comprise floating Salicide blocks, which are silicide formed by a self-aligned method.

7. An electrostatic discharge (ESD) protection circuit formed on a semiconductor substrate and coupled to an input/output (I/O) port and an internal circuit, the ESD protection circuit comprising:

a gate electrode with a gate oxide layer located on the semiconductor substrate;

a drain region and a source region in the semiconductor substrate at each side of the gate electrode;

an insulating layer covering over the gate electrode, the source region and the drain region;

at least one drain contact in the insulating layer so as to have a contact to the drain region, which is coupled to the I/O port and the internal circuit through the drain contact;

at least one source contact in the insulating layer so as to have a contact to the source region, which is coupled to a voltage line through the source contact; and a plurality of floating silicide blocks about uniformly scattering on the drain region, wherein the floating silicide blocks are between the insulating layer and the substrate at the drain region.

8. The ESD protection circuit claim 7, wherein the floating silicide blocks are arranged on nodes of a slanted grid-like structure.

9. The ESD protection circuit claim 7, wherein shapes of the floating silicide blocks comprise a bar-like shape.

10. The ESD protection circuit claim 7, wherein shapes of the floating silicide blocks comprise a circular-like shape.

11. The ESD protection circuit claim 7, wherein shapes of the floating silicide blocks comprise a combination of various geometric shapes.

12. The ESD protection circuit claim 7, wherein the floating silicide blocks comprise floating Salicide blocks, which are silicide formed by a self-aligned method.

13. The ESD protection circuit claim 7, wherein the voltage line coupled to the source region has a ground voltage.

* * * * *